(12) United States Patent
Walker

(10) Patent No.: US 8,405,403 B2
(45) Date of Patent: Mar. 26, 2013

(54) DETERMINING SOLENOID HEALTH

(75) Inventor: Andrew Walker, Lichfield (GB)

(73) Assignee: Rolls-Royce PLC, London (GB)

(*) Notice: Subject to any disclaimer, the term of this patent is extended or adjusted under 35 U.S.C. 154(b) by 436 days.

(21) Appl. No.: 12/689,856

(22) Filed: Jan. 19, 2010

(65) Prior Publication Data
US 2010/0201375 A1 Aug. 12, 2010

(30) Foreign Application Priority Data
Feb. 9, 2009 (GB) .................................. 0901947.2

(51) Int. Cl.
*G01R 31/06* (2006.01)
(52) U.S. Cl. ........................................ 324/546; 324/545
(58) Field of Classification Search .................. 324/545, 324/546; 307/33; 137/554
See application file for complete search history.

(56) References Cited

U.S. PATENT DOCUMENTS

| | | | | |
|---|---|---|---|---|
| 4,056,732 A | * | 11/1977 | Martin | 307/33 |
| 4,170,040 A | * | 10/1979 | Leblanc et al. | 701/123 |
| 6,326,898 B1 | | 12/2001 | O'Leyar et al. | |
| 6,917,203 B1 | * | 7/2005 | Perotti et al. | 324/418 |
| 6,968,859 B1 | * | 11/2005 | Nagano et al. | 137/554 |

FOREIGN PATENT DOCUMENTS

| | | |
|---|---|---|
| FR | 2 445 005 A1 | 10/1979 |
| GB | 2 262 809 A | 6/1993 |
| GB | 2 382 227 A | 5/2003 |
| JP | A-11-108232 | 4/1999 |

OTHER PUBLICATIONS

Great British Search Report issued in Great British Patent Application No. 0901947.2 on Mar. 25, 2009.

* cited by examiner

*Primary Examiner* — Vincent Q Nguyen
(74) *Attorney, Agent, or Firm* — Oliff & Berridge, PLC

(57) ABSTRACT

A health monitoring arrangement for a solenoid includes an armature for coupling to the solenoid, the armature being displaceable proportional to a driving current applied to the solenoid. A monitoring coil is wound around the armature such that the armature is displaceable relative to the monitoring coil. A voltage monitor coupled to the monitoring coil generates a voltage signature in respect of the solenoid that is proportional to the armature displacement. An analyzer analyzes the voltage signature to determine the health of the solenoid. Also a method of monitoring the health of a solenoid is provided.

12 Claims, 2 Drawing Sheets

DETERMINING SOLENOID HEALTH

The present invention relates to an arrangement and a method for determining the health of a solenoid. The invention is particularly, although not exclusively, applicable to determining the health of solenoids used in gas turbine engines.

It is known to monitor the driving current of a solenoid in order to ascertain whether the solenoid is functioning properly. U.S. Pat. No. 6,326,898 discloses a method and apparatus, for an image forming system, which measures the actuating current supplied to the solenoid at least at the beginning and after the end of the armature movement. The current is then compared to known current signatures in order to determine whether the armature has translated through its full movement range within the desired time interval.

Another conventional method and apparatus are disclosed in U.S. Pat. No. 6,917,203, in which a current signature sensor is provided to monitor the actuating current supplied to the solenoid. The current signature is compared to known signatures to provide an indication of the health of the solenoid.

One disadvantage of both these methods and apparatuses is that when a fault is detected it is not clear whether the solenoid or the current supply is at fault. This means that additional testing is required before a confirmed fault diagnosis can be provided, and repair or part replacement be effected.

A further disadvantage, particularly as relates to the use of either disclosed method or apparatus in the context of solenoids used in aircraft gas turbine engines, is that the monitoring is only on one side of the signal path. This means that common mode noise in the signal, such as radar radiation, high intensity radiated fields or other electromagnetic emissions, cannot be identified and rejected. Although this can be overcome by the provision of current monitoring on both sides of the signal path, with subsequent processing to reject common mode noise, this inevitably adds weight and cost, both of which are especially undesirable in airborne solenoid applications.

The present invention seeks to provide an arrangement and a method for determining the health of a solenoid that seeks to address the aforementioned problems.

Accordingly the present invention provides a health monitoring arrangement for a solenoid, the arrangement comprising: an armature for coupling to a solenoid coil, the armature being displaceable proportional to a driving current applied to the solenoid coil; a monitoring coil wound around the armature such that the armature is displaceable relative to the monitoring coil; a voltage monitor coupled to the monitoring coil to generate a voltage signature in respect of the solenoid coil that is proportional to the armature displacement; and analysing means to analyse the voltage signature to determine the health of the solenoid.

This provides the advantage that the health of the solenoid can be monitored without requiring additional moving parts.

The monitoring coil may be wound concentrically with the solenoid coil.

The analysing means may compare the voltage signature with characteristic voltage signatures corresponding to known states of health. Additionally or alternatively the analysing means may apply a cumulative sum ("CUSUM") algorithm which outputs a CUSUM voltage for at least defined time intervals. The analysing means may compare the CUSUM voltage with characteristic voltages corresponding to known states of health.

The monitoring coil may comprise a solenoid coil. This may be a standby solenoid coil.

The present invention also provides a method of monitoring the health of a solenoid comprising: providing a solenoid coil to be monitored; providing an armature coupled to the solenoid coil which is displaceable proportional to a driving current applied to the solenoid coil; providing a monitoring coil wound around the armature such that the armature is displaceable relative to the monitoring coil; generating a voltage signature in respect of the solenoid coil by monitoring the voltage generated in the monitoring coil that is proportional to the armature displacement; and analysing the voltage signature to determine the health of the solenoid.

The method has the advantage of enabling the health of a solenoid to be monitored without adding extra moving parts.

The analysing step may comprise comparing the voltage signature with characteristic voltage signatures corresponding to known states of health. Alternatively or additionally the analysing step may comprise applying trend analysis (e.g., to attempt to identify a pattern or trend). The analysing step may comprise applying a CUSUM algorithm to generate a CUSUM voltage for at least defined time intervals. The analysing step may comprise comparing the CUSUM voltage with characteristic voltages corresponding to known states of health.

The method may comprise applying common mode rejection of noise signals in the monitored voltage.

The present invention also provides a gas turbine engine comprising a health monitoring arrangement and/or a method of monitoring the health of a solenoid as described in the preceding paragraphs.

The present invention will be more fully described by way of non-limiting example with reference to the accompanying drawings, in which.

Figure 1:
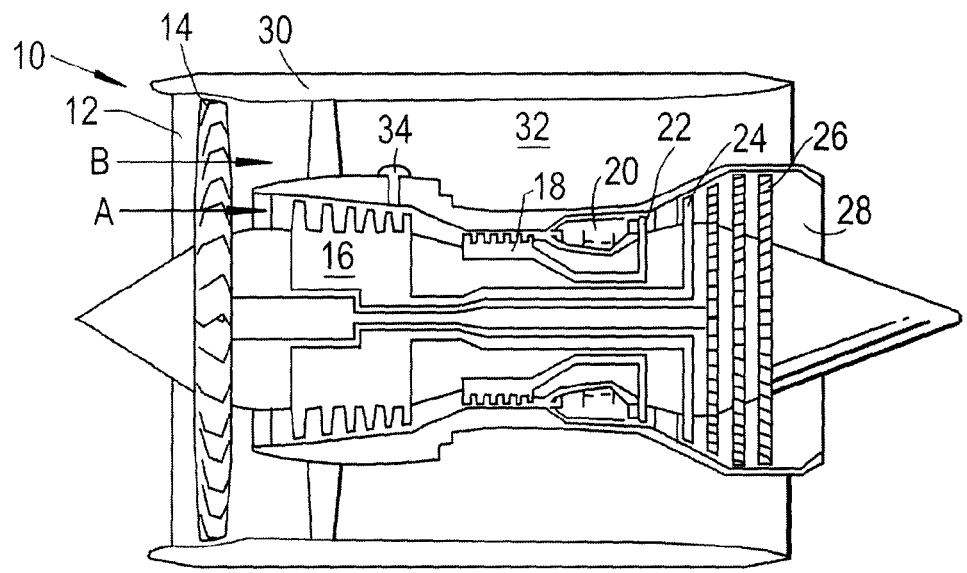
FIG. 1 is a sectional side view of a gas turbine engine.

A gas turbine engine 10 is shown in FIG. 1 and comprises an air intake 12 and a propulsive fan 14 that generates two airflows A and B. The gas turbine engine 10 comprises, in axial flow A, an intermediate pressure compressor 16, a high pressure compressor 18, a combustor 20, a high pressure turbine 22, an intermediate pressure turbine 24, a low pressure turbine 26 and an exhaust nozzle 28. A nacelle 30 surrounds the gas turbine engine 10 and defines, in axial flow B, a bypass duct 32.

Solenoids requiring monitoring are utilised for many applications within a gas turbine engine 10, for example to activate bleed valves 34 to bleed air from the compressors 16, 18, for cabin systems or turbine cooling. Other applications for a solenoid in a gas turbine engine 10 include activating the starter air valve, fuel return to tank valves and thrust reverser isolation valve.

Figure 2:
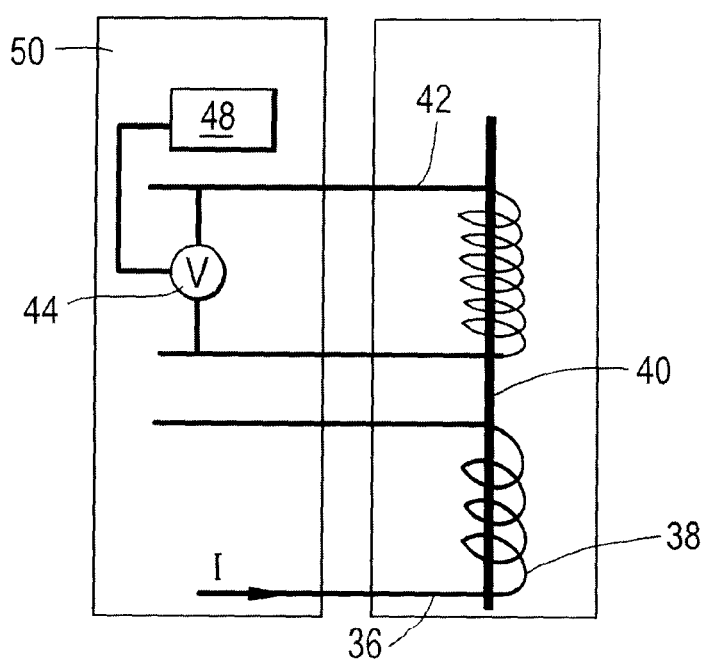
FIG. 2 is a schematic view of one embodiment of a solenoid monitoring arrangement according to the present invention.

An exemplary embodiment of the arrangement of the present invention is shown in FIG. 2 and is described in a non-limiting example with reference to monitoring the health of a solenoid 36 in a gas turbine engine 10. The solenoid 36 is driven by an actuating current I, supplied by a current source (not shown). The solenoid 36 comprises a coil 38 through which extends an armature 40. When the actuating current I is applied, the armature 40 moves linearly and causes an action to occur, for example a bleed valve 34 to open or close.

The present invention provides a monitoring coil 42 which is wound around the armature 40. When the armature 40 moves due to the applied actuating current I it induces flux in the monitoring coil 42. A voltage meter 44 coupled across the monitoring coil 42 measures the voltage V generated which is proportional to the rate of change of induced flux in the monitoring coil 42. The measured voltage V, plotted against time, provides a voltage signature (e.g. line 46 in FIG. 3) that is related to the movement of the armature 40. Thus, analysis of the voltage signature yields information about the extent of movement of the armature 40 and the time taken to achieve that movement. This ensures that faults that restrict or entirely impede the armature movement are detected and also enables deterioration in the rate of movement to be detected so that preventative maintenance can be scheduled.

The voltage meter 44 is coupled to analysis means 48, which may take the form of an independent piece of hardware or may be a software function within other control or monitoring equipment associated with the gas turbine engine 10, for example in the engine electronic controller (EEC) 50. Where the analysis means 48 is integral with the EEC 50 it may be efficient for the voltage meter 44 to be integral with the EEC 50 also, either as coupled hardware or as software functionality. The EEC 50 may also be the current source for the actuating current I.

The analysis means 48, howsoever constituted, analyses the voltage signature generated by the voltage meter 44 to determine the health of the solenoid 36. The analysis may take one or more of several forms. Firstly, the voltage signature may be compared with characteristic voltage signatures for known states of health of equivalent solenoids 36. This is discussed with reference to FIG. 3 below. Secondly, the analysing means 48 may apply a trending algorithm, for example a CUSUM algorithm, to output a voltage level at defined sample intervals corresponding to known points in the armature movement for a healthy solenoid 36. The output voltage levels may then be compared with characteristic voltages corresponding to known states of health. This is discussed with reference to FIG. 4 below.

Figure 3:
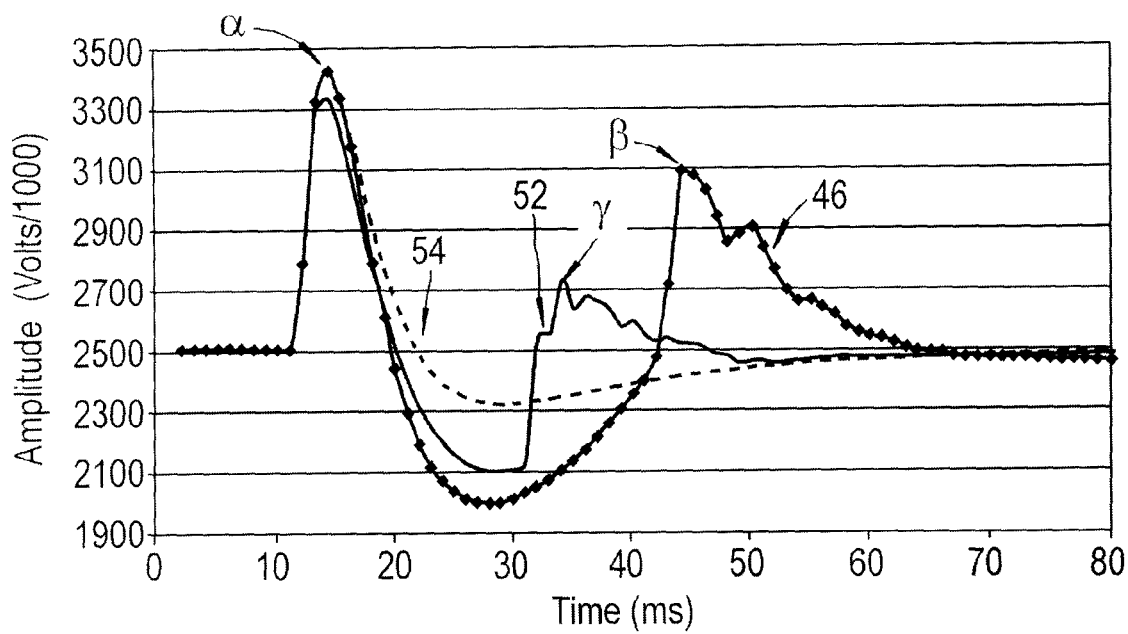
FIG. 3 is a graphical representation of characteristic voltage signatures for use in the present invention.

FIG. 3 plots voltage against time, following signal processing and measured in equal sample intervals, for an exemplary solenoid 36 monitored according to the present invention. Line 46 is the voltage signature of a healthy solenoid 36 and comprises a peak or spike a at around 15 ms. This peak $\alpha$ signifies the acceleration of the armature 40 from rest, which causes a high rate of change of induced flux and, hence, a large voltage V in the monitoring coil 42. The voltage V reduces as the armature 40 reaches a constant velocity and then increases again as the armature 40 accelerates towards its end stop and the air gap therebetween is reduced. A second peak at $\beta$, at around 45 ms, signifies the time at which this acceleration stops. Once the armature 40 abuts the end stop the flux, and therefore the voltage, decays at a rate determined by the coefficients of the system. Thus, the voltage signature 46 correlates with the linear movement of the armature 40. A voltage signature generated by a solenoid 36 in use can be compared to the voltage signature 46. Were the peaks approximately coincide with peaks $\alpha$ and $\beta$, in terms of time in milliseconds and voltage levels, it is understood that the solenoid 36 is healthy meaning it is actuated fully and at the desired rate. If there is an open circuit fault in the monitoring coil 42, no voltage is recorded so this is immediately detected. Similarly, if the monitoring coil 42 is short circuited, the voltage signature 46 will retain its shape but reduce in magnitude making this fault detectable also.

A second characteristic voltage signature 52 is also shown in FIG. 3 and relates to a solenoid 36 in which the movement of the armature 40 is impeded. Thus the initial acceleration of the armature 40 causing voltage spike $\alpha$ is the same as for voltage signature 46, as is the decay when the armature 40 has reached a constant velocity. However, when the armature 40 hits an unexpected obstacle to its movement there is a rapid acceleration of the armature 40 to close the air gap resulting in a premature voltage peak γ, shown at around 35 ms. Following this peak γ the voltage decays at the rate determined by the coefficients of the system. The peak γ is at a lower voltage than the peak $\beta$ of the healthy solenoid 36 so that the voltage signature 52 of the impeded armature 40 is clearly distinct from the voltage signature 46 of the healthy solenoid 36. Thus, the analysing means 48 is able to distinguish between the voltage signatures 46, 52 when comparing them to a generated voltage signature so that it is able to determine whether the solenoid 36 being monitored is healthy or impeded. The skilled reader will understand that a plurality of characteristic voltage signatures 52 may be required to correspond to solenoids 36 that are impeded at different distances of armature movement or the analysis means 48 may be arranged to discern a range of impeded movement by comparison with one characteristic voltage signature 52. As with the voltage signature 46, open circuit and short circuit faults in the monitoring coil 42 are detectable.

FIG. 3 also shows a third characteristic voltage signature 54 that corresponds to a solenoid 36 in which the armature 40 is unable to move at all. The armature 40 attempts to accelerate from rest and so the voltage signature 54 exhibits the peak or spike $\alpha$. However, since the armature 40 is unable to move from rest the voltage then decays away. Hence, the voltage signature 54 has only one peak $\alpha$, as opposed to the dual peaks exhibited in the healthy and impeded voltage signatures 46, 52, so that it is clearly distinguishable from these signatures. As with the voltage signature 46, open circuit and short circuit faults in the monitoring coil 42 are detectable.

The analysis means 48 is therefore able to compare a voltage signature generated for a solenoid 36 in use to the characteristic voltage signatures 46, 52, 54 and thereby determine whether the solenoid 36 is healthy, impeded or unable to move at all. This information may cause a control arrangement to switch operation from the degraded solenoid 36 to an alternative solenoid, may trigger a maintenance request or may trigger other actions as required.

Figure 4:
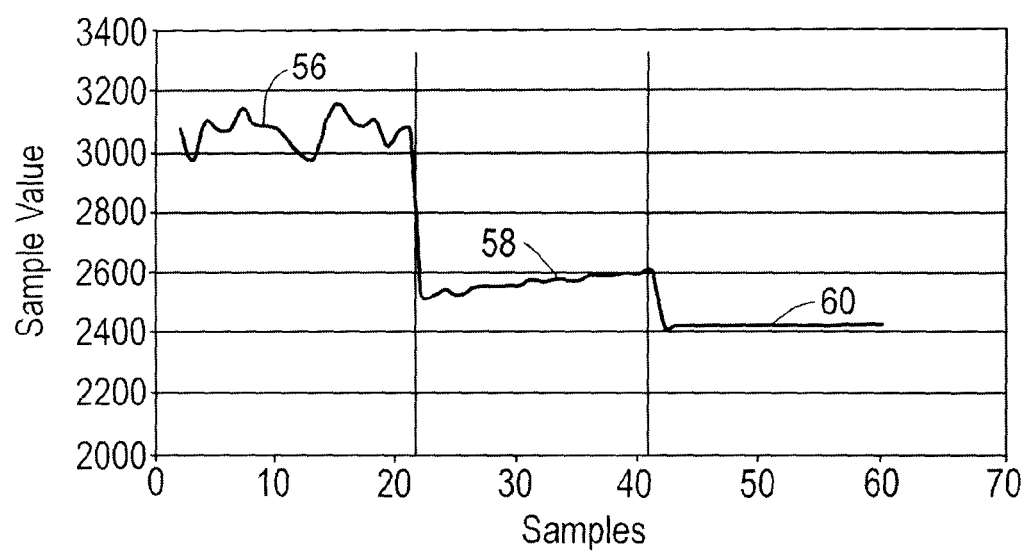
FIG. 4 is a graphical representation of characteristic CUSUM voltages for use in the present invention.

Additionally or alternatively the analysis means 48 may apply a trending algorithm, preferably the CUSUM algorithm. This is applied to successive cycles of the armature movement and requires a specific time interval to be chosen. Thus in an exemplary trial to demonstrate the use of the algorithm, the voltage was recorded every 45 samples and the CUSUM algorithm applied to provide a mean value. In FIG. 4 a plurality of successive recorded voltages is plotted against time.

In a first time period 56 the solenoid 36 was healthy and unimpeded. In this time period 56 the recorded voltages vary in approximately the range 3000 to 3200 which corresponds to the peak $\beta$ of characteristic voltage signature 46 in FIG. 3. After around 20 samples an obstruction was placed in the path of the armature 40 to impede its movement. Thus, in this second time period 58 the mean recorded voltage is around 2600, which corresponds to the voltage level at 45 samples of the characteristic voltage signature 52 in FIG. 3. After around 20 samples more the movement of the armature 40 was wholly impeded so that no movement was possible, and the voltage dropped to a base level as shown in the third time period 60 of FIG. 4. As in the previous time periods 56, 58, this voltage corresponds to the voltage level at 45 samples of the characteristic voltage signature 54 in FIG. 3.

It can be seen from FIG. 4 that the voltages produced using the CUSUM algorithm can also be used by the analysing means 48 to determine the health of the solenoid 36 since three clearly distinct voltages are produced depending on whether the armature 40 of the solenoid 36 is healthy, impeded or entirely unable to move. Therefore, the analysing means 48 may use the CUSUM algorithm in addition to comparing the generated and characteristic voltage signatures, to provide a confirmatory diagnosis, or may use the CUSUM algorithm instead of the voltage signature comparison.

In a variation to the embodiment of the present invention described hereinbefore, in some applications the solenoid 36 being monitored has a backup solenoid wound around the same armature 40 so that, in the event of a failure of the main solenoid 36, actuation can be switched to the backup solenoid. In this case the present invention can be advantageously implemented without any additional components, since the backup solenoid can perform the function of the monitoring coil 42. This means that existing dual solenoid arrangements, in gas turbine engines 10 or elsewhere, can benefit from the health monitoring of the present invention with little alteration required. Indeed, in many applications of dual solenoids there is already voltage monitoring to the extent of detecting whether a voltage is present, so a software change may be the only required alteration in order to benefit from the advantages of the present invention.

Similarly, although FIG. 2 illustrates the solenoid coil 38 and the monitoring coil 42 located adjacent to each other and coaxial, with the armature 40 extending along the common axis, other arrangements are possible. In particular, the monitoring coil 42 may be wound around the outside of the solenoid coil 38, or vice versa, so that they are concentric. This means that the present invention also finds utility in other devices, such as linear variable differential transformers.

The arrangement and method of the present invention uses the generated voltage in the monitoring coil 42 and so it measures across both sides of the signal path. Thus common mode noise signals can be easily identified and rejected without requiring duplicate sensors and processing. This means the arrangement of the present invention is lighter, cheaper and simpler than the prior art current sensor arrangements.

Since the arrangement of the present invention requires no additional moving parts, because it monitors the existing moving armature 40 of the solenoid 36 being monitored, it exhibits a high reliability compared with previous health monitoring arrangements. No additional sensors and associated wiring are required, unlike the current signature sensors of the prior art, which saves weight. This is particularly beneficial in aircraft applications where weight is critical to efficiency. The arrangement and method of using the arrangement is non-invasive, so failure of the monitoring arrangement will not impact upon the solenoid's ability to function as intended.

Although a plurality of recordings are shown in FIG. 4, it is clear that immediately the armature movement was impeded the voltage recording dropped. The absolute reading can therefore be used to determine the solenoid health rather than relying on comparison of a reading with other readings from the solenoid 36 over time. Therefore there is little delay is determining a change in the health of the solenoid 36 using the arrangement and method of the present invention.

Although the arrangement and method of the present invention have been described with reference to a solenoid 36 within a gas turbine engine 10, it is equally applicable to solenoids 36 in other fields. It is particularly well suited to applications where weight is critical, where it is difficult to do further testing to determine exactly which component is faulty, and in applications where it is critical that faults are detected and managed quickly.

The arrangement and method of the present invention may be used as a thrust reverser door switch for a gas turbine engine to indicate that the door has fully closed. Alternatively, it may find utility in an internal combustion engine to determine the health of a piston.

The invention claimed is:

1. A health monitoring arrangement for a solenoid, the arrangement comprising:
    a solenoid coil wound around an armature, the armature being displaceable proportional to a driving current applied to the solenoid coil;
    a monitoring coil wound around the armature such that the armature is displaceable relative to the monitoring coil;
    a voltage monitor coupled to the monitoring coil to generate a voltage signature in respect of the solenoid coil that is proportional to an armature displacement; and
    an analyzing means to analyze the voltage signature to determine the health of the solenoid by comparing the voltage signature with characteristic voltage signatures corresponding to known states of health of the solenoid.

2. The health monitoring arrangement of claim 1, wherein the monitoring coil is wound concentrically with the solenoid coil.

3. The health monitoring arrangement of claim 1, wherein the analyzing means applies a CUSUM algorithm that outputs a CUSUM voltage for at least defined time intervals.

4. The health monitoring arrangement of claim 3, wherein the analyzing means compares the CUSUM voltage with characteristic voltages corresponding to known states of health.

5. The health monitoring arrangement of claim 1, wherein the monitoring coil comprises a solenoid coil.

6. A gas turbine engine comprising the health monitoring arrangement of claim 1.

7. A method of monitoring the health of a solenoid comprising:
    providing a solenoid coil to be monitored;
    providing an armature around which the solenoid coil is wound, the armature being displaceable proportional to a driving current applied to the solenoid coil;
    providing a monitoring coil wound around the armature such that the armature is displaceable relative to the monitoring coil;
    generating a voltage signature in respect of the solenoid by monitoring a voltage generated in the monitoring coil that is proportional to the armature displacement; and
    analyzing the voltage signature to determine the health of the solenoid by comparing the voltage signature with characteristic voltage signatures corresponding to known states of health of the solenoid.

8. The method of claim 7, wherein the analyzing step comprises applying trend analysis.

9. The method of claim 7, wherein the analyzing step comprises applying a CUSUM algorithm to generate a CUSUM voltage for at least defined time intervals.

10. The method of claim 9, wherein the analyzing step further comprises comparing the CUSUM voltage with characteristic voltages corresponding to known states of health.

11. The method of claim 7, further comprising applying common mode rejection of noise signals in the monitored voltage.

12. The method of claim 7, wherein the method is performed on a gas turbine engine.

* * * * *